(12) United States Patent
Shekhar (10) Patent No.: US 11,308,005 B2
(45) Date of Patent: Apr. 19, 2022

(54) CACHE COHERENT, HIGH-THROUGHPUT INPUT/OUTPUT CONTROLLER

(71) Applicant: Intel Corporation, Santa Clara, CA (US)

(72) Inventor: Mrigank Shekhar, Canas, WA (US)

(73) Assignee: Intel Corporation, Santa Clara, CA (US)

( * ) Notice: Subject to any disclaimer, the term of this patent is extended or adjusted under 35 U.S.C. 154(b) by 784 days.

(21) Appl. No.: 16/022,327

(22) Filed: Jun. 28, 2018

(65) Prior Publication Data

US 2019/0042491 A1    Feb. 7, 2019

(51) Int. Cl.

| | |
|---|---|
| *G11C 29/00* | (2006.01) |
| *G06F 13/16* | (2006.01) |
| *G06F 11/10* | (2006.01) |
| *G06F 13/40* | (2006.01) |
| *G06F 12/0895* | (2016.01) |
| *G11C 7/10* | (2006.01) |
| *G06F 12/0815* | (2016.01) |
| *G11C 29/52* | (2006.01) |

(52) U.S. Cl.
CPC ...... *G06F 13/1668* (2013.01); *G06F 11/1004* (2013.01); *G06F 11/1068* (2013.01); *G06F 12/0815* (2013.01); *G06F 12/0895* (2013.01); *G06F 13/4022* (2013.01); *G11C 7/1048* (2013.01); *G06F 2213/0026* (2013.01); *G06F 2213/0032* (2013.01); *G11C 29/52* (2013.01)

(58) Field of Classification Search
CPC ............ G06F 13/1668; G06F 13/4022; G06F 11/1068; G06F 11/1004; G06F 12/0895; G06F 12/0815; G06F 2213/0026; G06F 2213/0032
See application file for complete search history.

(56) References Cited

U.S. PATENT DOCUMENTS

| | | | |
|---|---|---|---|
| 2005/0050240 A1* | 3/2005 | Wilkins | ................ G06F 3/0653 710/15 |
| 2008/0052463 A1* | 2/2008 | Chitlur | ................ G06F 12/0831 711/118 |
| 2021/0110292 A1* | 4/2021 | Minaburo | ............... H04L 69/22 |

OTHER PUBLICATIONS

Intel® FPGA IP, Core Cache Interface (CCI-P) Specification, Revision 0.5, Sep. 2017.

* cited by examiner

*Primary Examiner* — Samir W Rizk
(74) *Attorney, Agent, or Firm* — Fletcher Yoder, P.C.

(57) ABSTRACT

Input/output controllers and methods of operation thereof that may provide high-throughput data services to processing circuitry is described. The input/output controllers may make use of cache coherent data links and/or switch fabric to improve data throughput and decrease latency in the communication.

20 Claims, 6 Drawing Sheets

CACHE COHERENT, HIGH-THROUGHPUT INPUT/OUTPUT CONTROLLER

BACKGROUND

This disclosure relates to input/output (I/O) controllers that may be used by processing circuitry in electronic systems.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic systems that process data, such as data center servers, machine-learning systems, neural networks, artificial intelligence systems, database systems, and telecommunication systems, among others, may operate by employing data processing circuitry communicatively coupled to I/O controllers. For example, a processor may send and receive data from a network using a network adaptor. As another example, a processor may store data into and/or retrieve data from a storage device using a memory controller. As the processing speed and capacity of the processing circuitry increases, the capacity of the I/O controllers may become a limiting factor in the overall performance of the electronic systems. As such, improved throughput, increased bandwidth, and increase in the functions implemented in I/O controllers may dramatically improve the performance of operations of data processing electronic systems.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may use processing circuitry, such as processor(s), microcontroller(s), programmable logic devices, or application specific integrated circuits implementing data processing functions, to process and transform data. Examples of such systems include data centers, databases, internet servers, artificial intelligence systems, machine learning systems, neural networks, servers for mobile applications, and other similar systems. In such systems, the processing circuitry may employ input/output (I/O) controllers that may facilitate data exchanges between the processing circuitry and I/O devices. Examples of I/O controllers include network controllers (e.g., Ethernet controllers, Wireless adaptors), serial data controllers (e.g., universal serial bus (USB) controllers), parallel data controllers (e.g., Peripheral Component Interconnect Express (PCIe) controllers), and non-volatile media controllers (e.g., serial AT attachment (SATA) controllers, non-volatile memory express (NVMe)). Examples of non-volatile storage media that may be controlled by non-volatile media controllers include solid-state drive (SSD) disks, random access memory disks (RAMdisks), and hard disks (HD).

During operation of these electronic systems, the processing circuitry may use an operating memory device (e.g., a memory device external to the processor, such as in a random access memory (RAM) device or in a dynamic random access memory (DRAM) device) or a local memory (e.g., a local cache) as a working memory. Modifications applied to data in the processing circuitry may be applied initially to the data in this working memory. In certain systems, data may also be processed in functional modules. As discussed herein, functional modules may refer to functional circuitry that implements hard or soft logic that may be external to the processor and implemented and may be used to reduce the data processing load in the processing circuitry. Examples of functions that may be performed "off-processor" (i.e., in the I/O controller) by functional modules include compression, encryption, header parsing, header processing, protocol encoding and/or decoding, and/or timestamping. In these systems, the "off-processor" operations may also modify the data.

The data modified "off-processor" may be shared with the working memory of the processor. Embodiments described herein relate to I/O controller systems (e.g., integrated circuits that include switch controllers) that may employ expanded cache coherence domains that allow direct interaction between these functional units and the processor working memory. Moreover, the I/O controller systems may include switch fabrics, which may provide efficient routing between processor, I/O devices, and functional modules. The embodiments described herein may provide advantages such as a reduction of the number of data exchanges between operating memory and the I/O controller, an increase the bandwidth and the throughput for functional modules in the I/O controllers, and a decrease the latency between processing circuitry and I/O devices, among other things.

Figure 1:
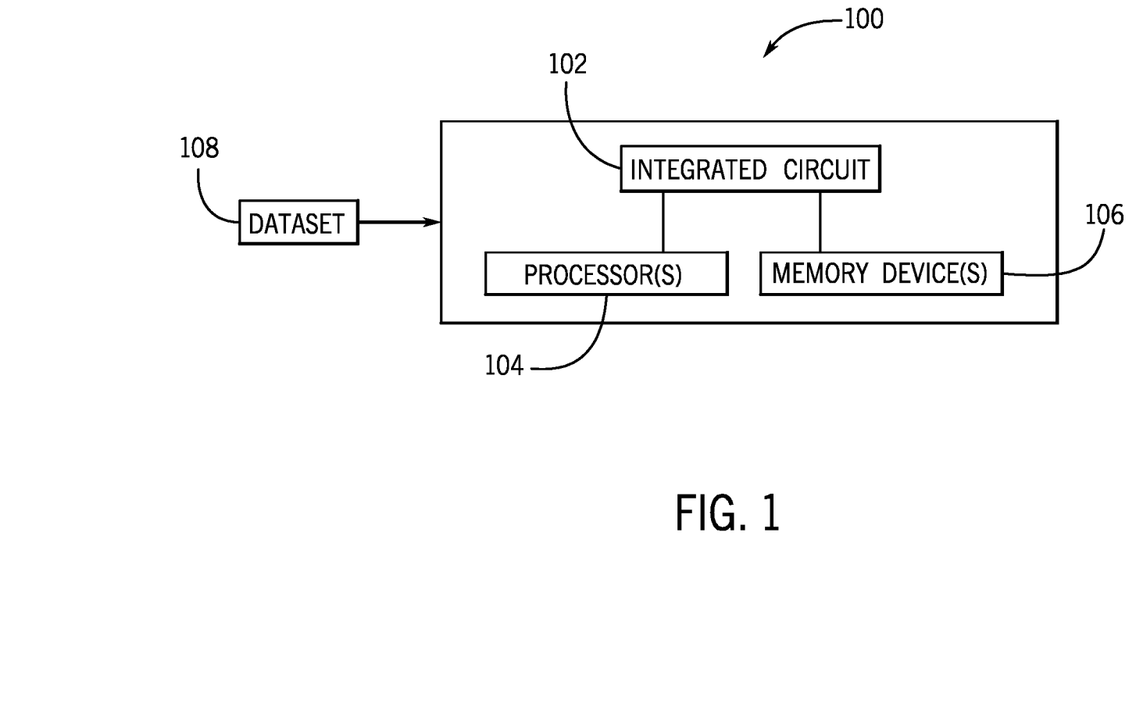
FIG. 1 is a block diagram of an electronic device that may use high-throughput input/output (I/O) controllers, in accordance with an embodiment.

With the foregoing in mind, FIG. 1 is a diagram of an electronic device 100 that may be used in a data processing system. The electronic device 100 may be one of multiple nodes of the data processing system. The electronic device 100 may include an integrated circuit 102, which may provide I/O controllers, as well as functional modules. The integrated circuit 102 may be implemented in one or more programmable logic devices (PLD), a field programmable gate arrays (FPGA), application specific integrated circuits (ASIC), and/or a hybrid devices that include hardened circuitry and programmable fabric.

The I/O controllers and functional modules may be implemented as a soft intellectual property (IP) block or a hard IP block. As described herein, functional modules may refer to logic blocks or logic functions that may be used to perform data operations. Examples of functional modules include modules that may perform compression operations, decompression operations, encryption operations, decryption operations, mathematical transformations (e.g., Fourier transform, convolutions, or matrix multiplication), filtering, and/or combination of the multiple operations. The integrated circuit 102 may also include transceivers, receivers, and/or transmitters to exchange data with the processor 104, local operating memory 106, and/or one or more I/O devices 108.

The electronic device 100 may include a processor 104, which may perform operations on data, as discussed above. The processor 104 may be a general-purpose processor that may operate on data using computer-readable instructions stored in a memory. The processor 104 may be implemented using one or more processor devices, which may have one or more processing cores. The processor 104 may also include a local cache that stores information and/or instructions locally to increase the speed of its operation. The processor 104 may also be coupled to an operating memory 106, which may be used to store information and/or instructions being processed. The operating memory 106 may be implemented as one or more volatile memory devices with low latency and low access times (e.g., RAM, and/or DRAM devices). The electronic device 100 may be implemented using a system-on-chip (SoC) that includes the integrated circuit 102, the processor 104, and/or the operating memory 106. The electronic device 100 may also be implemented as a system having a printed circuit board (PCB) or a motherboard that provides coupling to the integrated circuit 102, the processor 104, the operating memory 106, and/or a SoC having any of these components.

As discussed above, the electronic device 100 may communicate with one or more I/O devices 108. Examples of I/O devices 108 include network devices, serial data connection, parallel data connections, non-volatile storage devices, and/ or wireless devices. I/O controllers, which may be implemented in the integrated circuit 102, may be used to provide connectivity between the processor 104 and the I/O devices 108. As detailed below, the I/O controllers in the integrated circuit 102 may include cache coherent domains that may facilitate low latency access to the I/O devices 108. The integrated circuit 102 may also include functional modules that may provide data services (e.g., compression, encryption, header parsing) to the I/O controller, which may increase the bandwidth and the throughput between the I/O devices 108 and the processor 104. In some embodiments, the integrated circuit 102 may include a switch fabric to facilitate the routing of data between the processor, the I/O controller, and the functional modules.

Figure 2:
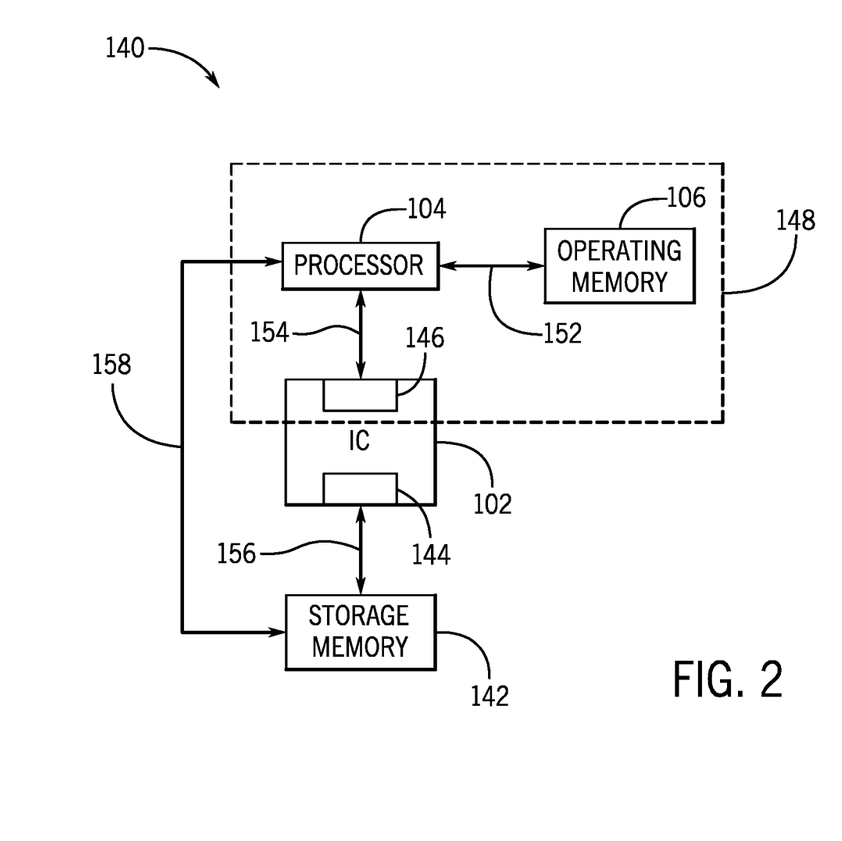
FIG. 2 is a block diagram of a system that employs a cache coherent, high-throughput memory controller, in accordance with an embodiment.

A diagram in FIG. 2 illustrates the data architecture for a system 140, which may be implemented with the electronic device 100 of FIG. 1. The system 140 may include a processor 104 and an operating memory 106. The system 140 also includes an integrated circuit 102 that may provide access to a non-volatile storage memory 142. To that end, the integrated circuit 102 may include a storage controller 144. The integrated circuit 102 may also include a cache memory 146.

The cache memory 146 in integrated circuit 102 may be, along with the operating memory 106 and the local cache in the processor 104, a part of a cache coherent domain 148. The memory elements (i.e., operating memory 106, cache memory 146, local cache in the processor 104) may replicate shared memory segments, that may be accessed by the integrated circuit 102 and/or the processor 104. Upon a modification of any data in the cache coherent domain by the integrated circuit 102 or by the processor 104, the replicates of the shared memory segments may be updated. In that manner, the shared memory in the cache coherent domain 148 may be consistent and the electronic device 100 may prevent issues from racing conditions during data processing. In order to maintain the cache coherent domain 148, the data link 152 between processor 104 and operating memory 106 and the data link 154 between processor 104 and cache memory 146 may be compliant with a cache coherent protocol (e.g., core cache interface protocol (CCI-P)).

To provide I/O connectivity, the integrated circuit 102 may be connected to the storage memory 142 via a data link 156. The data link 156 may be a high bandwidth data connection for transferring data. The storage memory 142 may also be controlled directly by the processor 104 via a control link 158. In some embodiments, the control link 158 may be routed through the integrated circuit 102. As an example, the storage memory 142 may be an NVMe compatible device. The data link 156 and the control link 158 may be implemented over a PCIe interface of the integrated circuit 102. In some embodiments, the data link 156 may provide the control link between the integrated circuit 102 and the storage memory 142. Control instructions from the processor 104 to the storage memory 142 may be provided using the PCIe interface, through control link 158. By contrast, data exchanges between the processor 104 and the storage memory 142 may take place using the data link 154, which may be cache coherent, and the data link 156.

Figure 3:
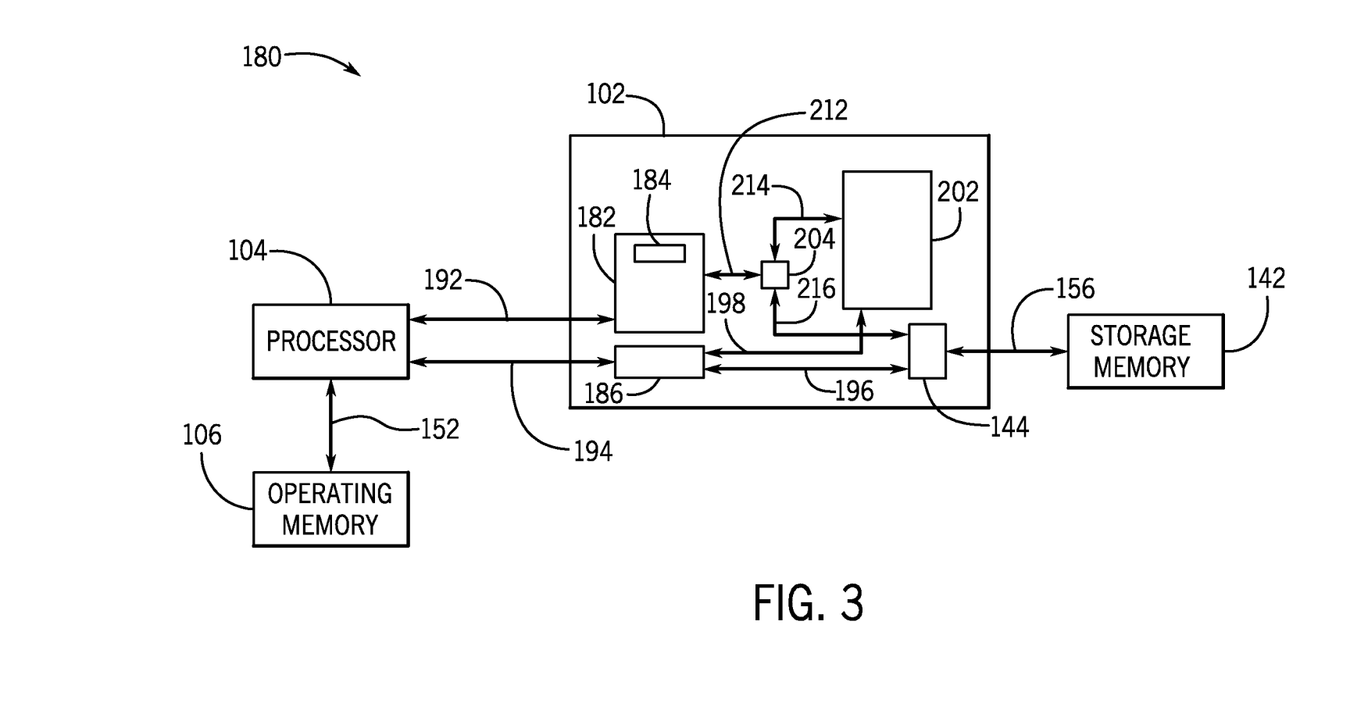
FIG. 3 is a block diagram of a system that employs a cache coherent, high-throughput storage controller with a switch fabric, in accordance with an embodiment.

The diagram 180 of FIG. 3 illustrates an embodiment for the integrated circuit 102. The diagram 180 also illustrates the connections between the processor 104, the operating memory 106, and the storage memory 142. The integrated circuit 102 may include a storage controller 144, which may provide access to the storage memory 142, and connect to it via a data link 156. The storage controller 144 may be a SATA controller and/or an NVMe controller. The integrated circuit 102 may include a cache coherent interface 182. The cache coherent interface 182 may include a cache 184, as discussed above. The integrated circuit 102 may have a second interface 186, which may be, for example, a PCIe interface. The cache coherent interface 182 may be connected to the processor 104 using a cache coherent connection 192. The interface 186 may be connected to the processor 104 using a connection 194, which may be a PCIe connection.

The integrated circuit 102 may also include a functional module 202. The functional module 202 may provide functionalities or services that transform data, such as data compression and/or decompression, encryption and/or decryption, mathematical operation accelerators (e.g., matrix summation, matrix multiplication), data sorting, signal processing (e.g., Fourier transforms, filtering), packet parsing (e.g., Ethernet packet parsing), and error detection and/or error correction (e.g., checksum, cyclic redundancy checking (CRC), T10 data integrity field (T10DIF). More generally, the functional module 202 may provide operations that may be performed "off-processor" to accelerate the performance of the electronic device 100. The functional module 202 may be implemented as a soft IP block or as hard IP block. It should be noted that the integrated circuit 102 may have multiple functional modules and that a single IP block may implement multiple functions.

As discussed above, the processor 104 may send control instructions directly to the storage memory 142, via the interface 186. The interface 186 may send commands directly to the storage controller 144, via an internal PCIe link 196. Moreover, the interface 186 may also have a data link 198 that routes data to the functional module 202. Therefore, in the embodiment illustrated in the diagram 180, the processor 104 may communicate with the functional module 202 and the storage memory 142 using an interface 186, which may be a PCIe interface. In systems having a legacy codebase (e.g., upgraded systems), the use of the interface 186 may allow backwards compatibility.

It should be noted that using the interface 186, the processor 104 and/or the operating memory 106 may touch (i.e., interact with) the data several times. For example, to perform instructions to perform data processing in the functional module 202 followed by writing the data to the storage memory 142 using the interface 186, the data may go from the processor 104 and/or operating memory 106 to the functional module 202 via interface 186, return to processor 104 and/or operating memory 106, sent to the storage memory 142 via interface 186, and sent to the storage controller 144. The use of the cache coherent interface 182 may decrease the number of touches (i.e., interactions between data and the processor 104 or operating memory 106) performed for that operation due to the use of the cache coherent interface 182 and a switch fabric 204, as detailed below.

The cache coherent interface 182 may receive data via the cache coherent connection 192. The cache coherent interface 182 may be coupled to the switch fabric 204 via an internal link 212. In some embodiments, the internal link 212 may also comply with a cache coherence protocol and, as a result, the switch fabric 204 may be part of the cache coherence domain. The switch fabric 204 may also be coupled to the functional module 202 via a link 214 and to the storage controller 144 via link 216. Moreover, the switch fabric 204 may receive data routing instructions from the processor 104 or from other logic in the integrated circuit 102. In an example in which the processor 104 performs instructions to process data in the functional module 202 and to write the data in the storage memory 142, the data from the processor 104 and/or operating memory 106 may be routed to the functional module 202 from the interface using the switch fabric 204. Upon completion of the process by the functional module 202, the switch fabric 204 may be used to route the data directly to the storage controller 144, without being sent to the processor 104 and/or operating memory 106. The reduction in the number of touches by the processor 104 and/or operating memory 106 due to the direct routing using the switch fabric 204 may decrease latency in the system.

The system illustrated in diagram 180 may also increase the throughput of data from the processor 104 to the storage memory 142 using compression. In certain architectures, the cache coherent connection 192 and/or the connection 194 may have higher bandwidth than the data link 156. In such system, the integrated circuit 102 may have a functional module 202 that implements data compression and decompression functions, which may lead to an increase in the storage throughput. For example, the cache coherent connection 192 may have a bandwidth capacity of 12 Gbps and the data link 156 has a may have a bandwidth capacity of 6 Gbps. Accordingly, without any compression, the bandwidth of the data link 156 may limit the bandwidth between the storage memory 142 and the processor 104.

By using a functional module 202 that implements a compression algorithm, the effective bandwidth of the data link 156 may be increased. For example, during a write process, data received by the integrated circuit 102 at 12 Gbps may become, after compression at 2:1 ratio, be transmitted using a 6 Gbps data link. In other words, the effective bandwidth of the data link 156 (e.g., the uncompressed bandwidth) may be increase as a factor of the compression ratio provided by the functional module 202. As such, the lower bandwidth of data link 156 may be effectively increased. It should also be noted that in such system, the storage memory 142 may be effectively expanded, as the data stored is in compressed form.

The use of the cache coherent interface 182 may also increase the speed of access to data by the processor 104. For example, if a processor 104 requests replacement of data in its coherence domain by data in the storage memory 142, the integrated circuit 102 may retrieve the data from the storage memory 142 and perform the replacement directly in the cache 184. The updated data may become directly accessible to the processor 104 without an additional step of transferring the updated data to the operating memory 106, which may decrease lag in data access.

Figure 4:
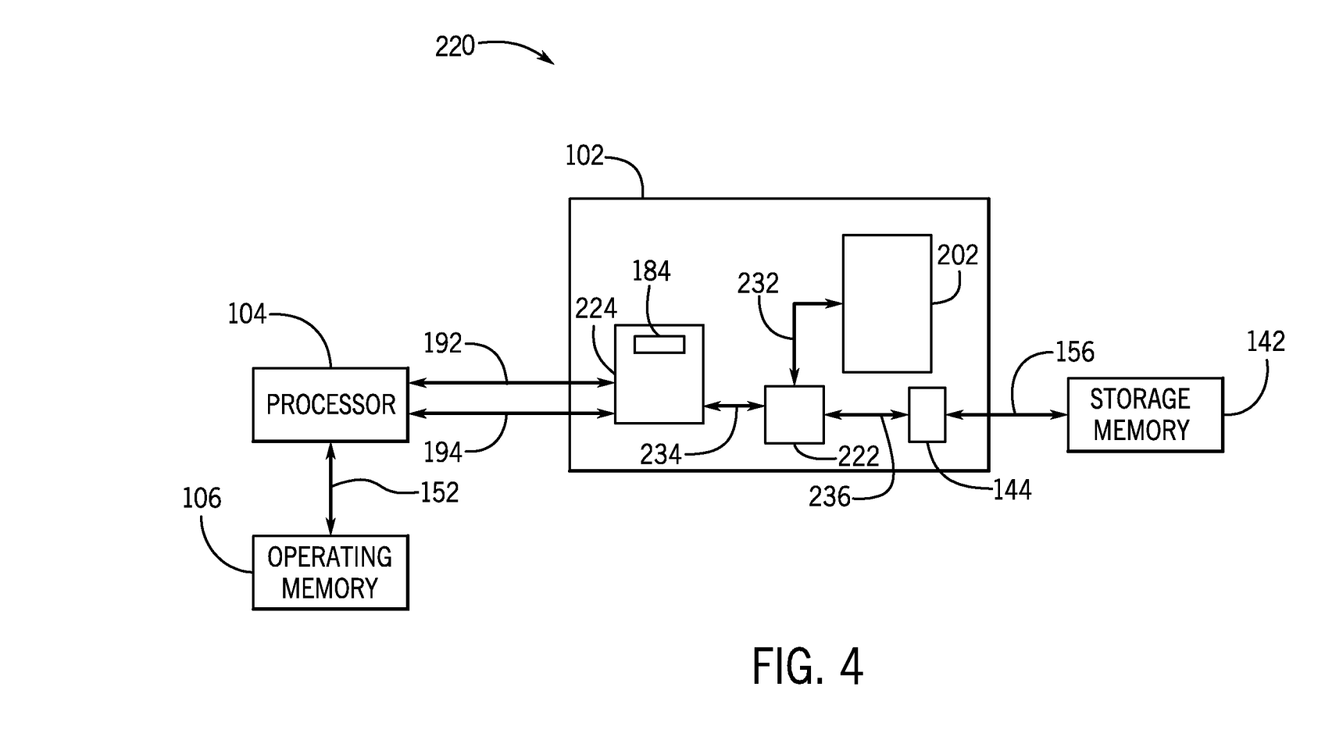
FIG. 4 is a block diagram of a system that employs a cache coherent, high-throughput storage controller with an integrated switch fabric, in accordance with an embodiment.

A diagram 220 of FIG. 4 illustrates another embodiment for the integrated circuit 102. The diagram 220 also illustrates the connections from the integrated circuit 102 to the processor 104, the operating memory 106, and to the storage memory 142. As in FIG. 3, the integrated circuit 102 may include a storage controller 144 that may provide access to the storage memory 142, and may connect to it via a data link 156. In the integrated circuit 102 of the diagram 220, the integrated circuit 102 may have a unified interface 224. The unified interface 224 may include a cache 184, as discussed above. The unified interface 224 may be connected to the processor 104 by a cache coherent connection 192 and by a second connection 194 (e.g., a PCIe connection). The unified interface 224 may coordinate the data received from the two connections 192 and 194. In some embodiments, only the cache coherent connection 192 has direct access to the cache 184.

In the system illustrated in diagram 220, the integrated circuit 102 may have a single switch fabric 222. The single switch fabric 222 may be programmed to route data between the unified interface 224 via link 234, the functional module 202 via link 232, and the storage controller 144 via link 236. Control of data routing in the single switch fabric 222 may take place through instructions received from the processor 104 and/or logic in the integrated circuit 102. In the system illustrated by diagram 220, the presence of the unified interface 224 and of the single switch fabric 222 may facilitate integrated routing of data and prevent racing conditions between processor 104, the functional module 202 and in the storage controller 144, and decrease the possibility of data corruption.

The presence of the single switch fabric 222 and the unified interface 224 with a cache 184 may also increase the throughput and decrease the latency between the processor 104 and the storage memory 142. For example, when the processor 104 performs instructions to process data in the functional module 202 and to write data to the storage memory 142, the data from processor 104 and/or operating memory 106 may be initially routed to the functional module 202 through the unified interface 224, routed by single switch fabric 222. Upon completion of the process by the functional module 202, the single switch fabric 222 may then route the data directly to the storage controller 144, without an additional step of sending the data to the processor 104 and/or operating memory 106. The direct routing of data from the functional module 202 to the storage memory 142 may decrease latency in the operations of the system.

The system illustrated in diagram 220 may also allow for increased throughput of data from the processor 104 to the storage memory 142 using compression. In certain architectures, the cache coherent connection 192 and/or the connection 194 may have, combined or separately, a higher bandwidth than the data link 156 that couples to the storage memory 142. In such system, the integrated circuit 102 may have a functional module 202 that implements data compression and decompression functions to increase the storage bandwidth. For example, the connections 192 and/or 194 may have a bandwidth capacity of 12 Gbps and the data link 156 has a may have a bandwidth capacity of 6 Gbps. As a result, the bandwidth of the data link 156 may be limiting factor in the storage throughput for the processor 104. A functional module 202 that implements a compression algorithm may increase the effective bandwidth of the data link 156. For example, during a writing process, data received by integrated circuit 102 at 12 Gbps may be transmitted using a data link at 6 Gbps after a 2:1 compression. Therefore, the compression may effectively increase the bandwidth of data link 156 (e.g., the uncompressed bandwidth) is doubled in this example. Moreover, using compression during transmission as discussed above, the storage memory 142 may have an increased effective storage capacity, as the data stored is in compressed form.

Figure 5:
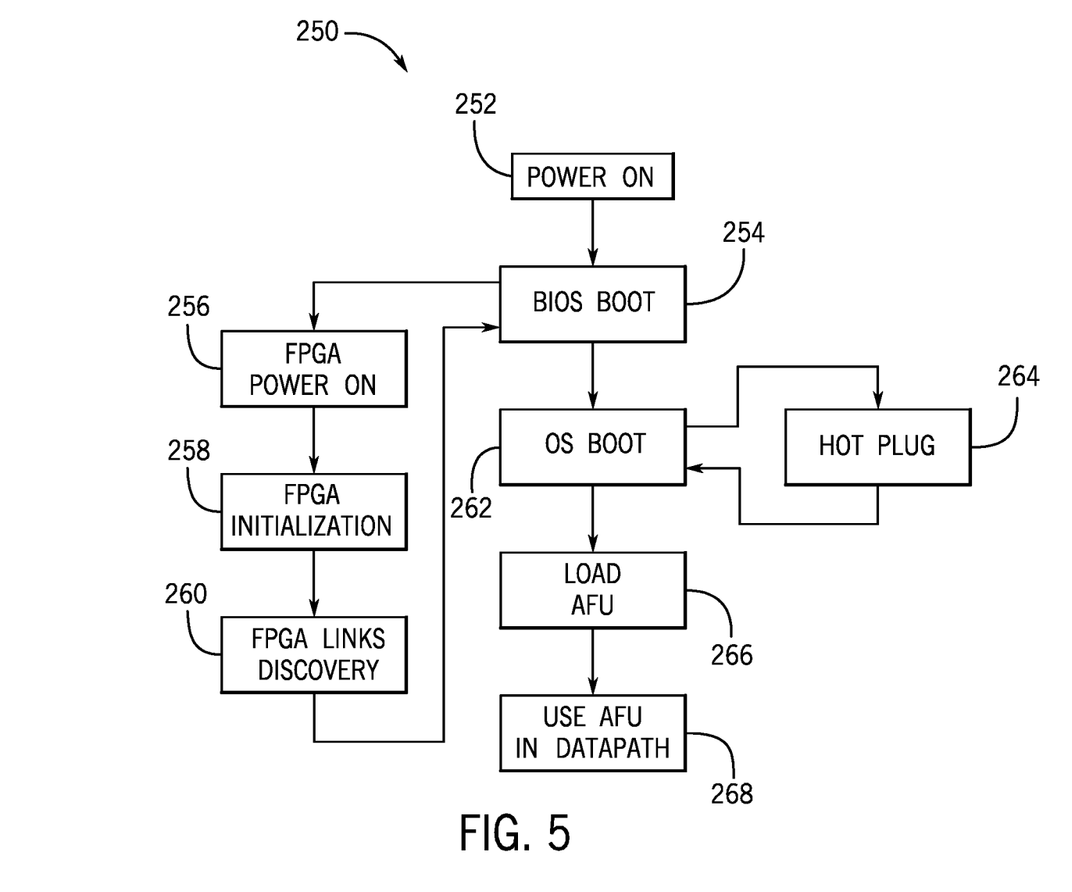
FIG. 5 is a flow chart for a method to initialize a data processing system with an I/O controller, in accordance with an embodiment.

With the foregoing in mind, the 250 of FIG. 5 illustrates a method 250 for initialization of a system such as the electronic device 100 of FIG. 1. Initialization of the electronic device 100 may take place in box 252. A basic input/output system (BIOS) boot process in box 254 may load initialization instructions to the processor. Initialization instructions in the BIOS may include instructions to communicate with connected hardware, which may include initialization of I/O controllers, in boxes 256, 258, and 260. In box 256, the I/O controller may be powered on. In box 258, the I/O controllers may be initialized by resetting the state of its registers and/or memory banks to an initial position. In box 260, the I/O controller may perform operations to detect and establish connection to the I/O devices that are attached to the I/O controllers.

Following the BIOS boot, an operating system (OS) that is running in the processor may be initialized in box 262. During this process, I/O devices (e.g., the I/O device detected in box 260) and/or I/O controllers may be detected (e.g., the controller powered on in box 256) by the processor, as illustrated in box 264. Following the OS boot, the functional modules (e.g., accelerator functional units (AFU)) may be loaded in box 266. In some embodiments, the loading of box 266 may take place by a reconfiguration of programmable fabric with soft IP in the integrated circuit. In some embodiments, the loading of box 266 may take place by the provision of power (e.g., activation of a clock tree, switching of a power rail) to the functional module. In some embodiments, the loading of the function modules (box 266) may take place during the initialization of the I/O controller (boxes 256, 258 and 260). At the end of the initialization process of method 250, the functional module may become available to for use in the data path between the processor and the I/O controller.

Figure 6:
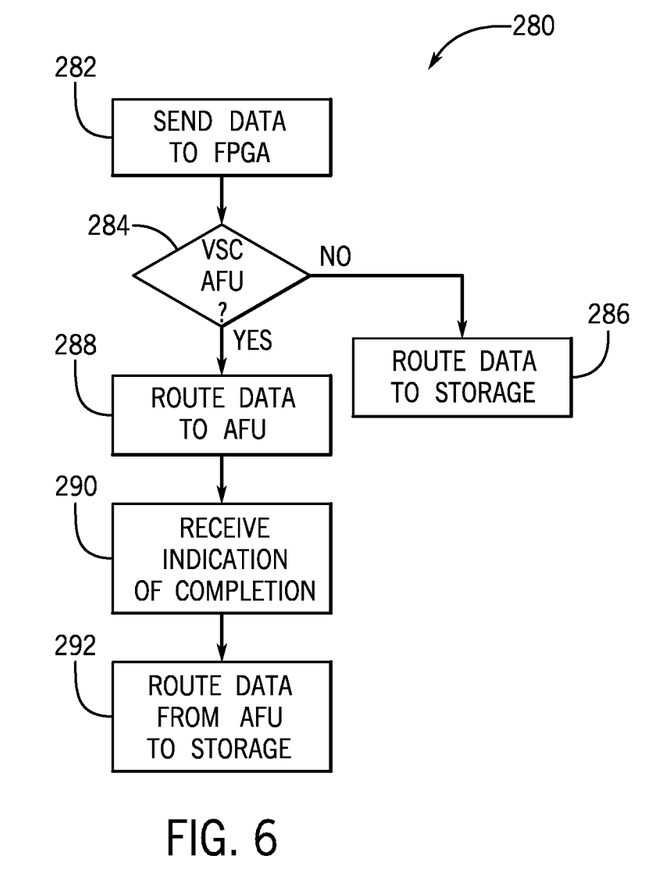
FIG. 6 is a flow chart for a method to send data from processing circuitry using the high-throughput I/O controller and functional modules, in accordance with an embodiment.

The method 280 to write data from a processor to a storage device, illustrated in the flowchart of FIG. 6, illustrates the use of accelerators in the I/O data path. In a box 282, the processor may initiate the writing process by sending data to the integrated circuit having a controller. The processor may also request usage of a functional module (e.g., AFU) in the data path (decision block 284). If the functional module is not used, the data received by the integrated circuit may be routed to the storage device through the switch fabric (box 286). If the functional module is used, the data received by the integrated circuit may be initially routed to the functional module (box 288). The functional module may process the data.

Upon completion, the processor may receive indication that the data is ready for further processing (box 290). The functional module may indicate completion by updating a status in a shared memory (e.g., a completion queue, a flag, a register bank), which may be in the coherence domain and may be polled by the processor. The functional module may also send an interrupt to the processor to indicate completion. Following the reception of a notification of completion, the processor may request routing of the data from the functional module to the storage device (box 292). The processed described in method 280 does not necessarily route the processed data back to the processor and/or to the operating memory following completion, which may reduce the latency in the communication. Moreover, as discussed above, the use of compression service in the functional unit, as described herein, may increase the effective bandwidth and the effective storage in the memory device due to compression.

Figure 7:
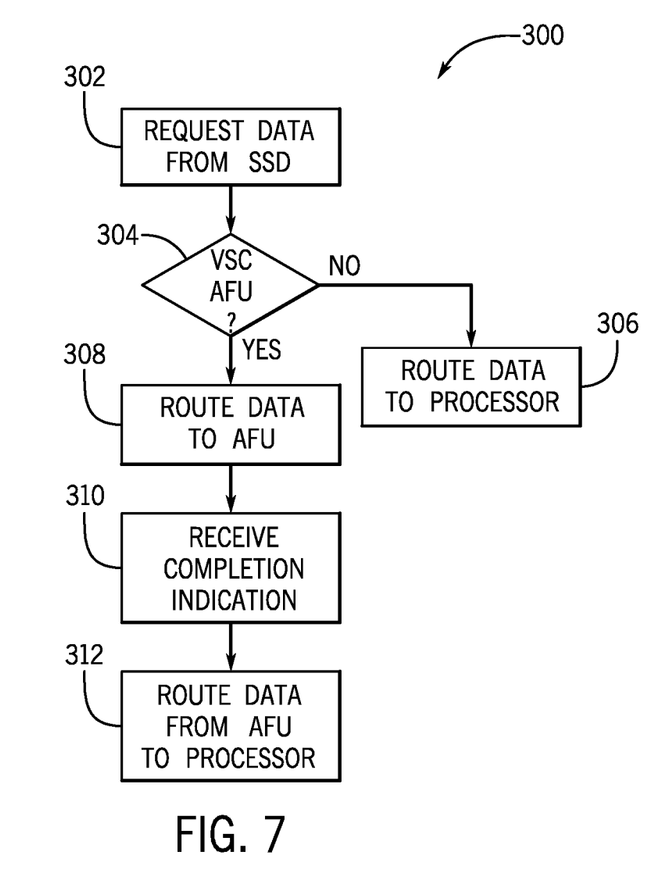
FIG. 7 is a flow chart for a method to receive data from processing circuitry using the high-throughput I/O controller and functional modules, in accordance with an embodiment.

The method 300 to read data from a processor to a storage device, illustrated in the flowchart of FIG. 7, illustrates the use of accelerators in the I/O data path during a read process. In a box 302, the processor may initiate the writing process by requesting data to the integrated circuit having a controller. Such request may include an indication of the address and/or the content type of the data requested. The processor may also request usage of a functional module (e.g., AFU) in the data path (decision block 304). In some embodiments, the request in decision block 304 may take place in the I/O controller. For example, the I/O controller may parse a header of the data received and identify a field that indicates encryption, compression, or some other modification that may be processed by a functional module or service of the integrated circuit. In such system, the I/O controller may request the use of a functional block in decision block 304.

If the functional module is not used, the data received by the integrated circuit from the storage drive may be routed to the storage device through the switch fabric (box 306). If the functional module is used, the data received by the integrated circuit may be initially routed to the functional module (box 308). The functional module may process the data. As discussed in the writing process, the processor may receive indication that the data is ready for further processing (box 310).

The functional module may indicate completion by updating a status in a shared memory (e.g., a completion queue), which may be in the coherence domain and may be, thus, polled by the processor. The functional module may also send an interrupt to the processor to indicate completion. Following the indication of completion, the processor may request routing of the data from the functional module to the processor (box 312). The processed described in method 300 may be used to pre-process data using existing functional units and decreasing processing demands. Moreover, as discussed above, the use of a decompression service in the functional unit, as described herein, may increase the effective bandwidth and the effective storage in the memory device without increase in the processor resource demands.

The use of the embodiments described herein may provide advantages which include allowing the processor and functional modules and data processing accelerators to operate in the same storage data simultaneously without losing data consistency, recusing the number of touches of data by the processor and operating memory, increasing the I/O throughput by employing additional data links and/or compression, decrease in the latency in data transfers, decreased power consumption by the processor, and/or improved power balances between processor and associated I/O controllers.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An integrated circuit comprising:
   an interface configured to couple to processing circuitry, wherein the interface comprises a cache memory and wherein the interface is configured to couple to the processing circuitry using a cache coherent data link that comprises a cache coherent protocol;
   an input/output controller configured to couple to an input/output device;
   functional circuitry configured to perform at least a first data operation; and
   switch fabric configured to route data between the cache memory of the interface and the functional circuitry, the interface and the input/output controller, or the functional circuitry and the input/output controller.

2. The integrated circuit of claim 1, wherein the first data operation comprises a compression operation, a decompression operation, an encryption operation, a decryption operation, an error checking operation, or a mathematical transformation, or any combination thereof.

3. The integrated circuit of claim 1, wherein the integrated circuit comprises a programmable fabric that comprises the interface, the input/output controller, the functional circuitry, or the switch fabric, or any combination thereof.

4. The integrated circuit of claim 1, wherein the interface comprises a Peripheral Component Interface Express (PCIe) interface.

5. The integrated circuit of claim 1, wherein the input/output controller comprises a non-volatile memory extended (NVMe) controller, and wherein the input/output device comprises a non-volatile memory device.

6. The integrated circuit of claim 1, wherein the switch fabric is coupled to the cache memory of the interface via a second cache coherent data link that comprises the cache coherent protocol.

7. The integrated circuit of claim 6, comprising a second interface configured to couple to the processing circuitry.

8. An electronic device, comprising:
   a processor;
   a storage device; and
   an integrated circuit comprising:
      an interface coupled to the processor;
      a storage controller coupled to the storage device;
      functional circuitry configured to perform a first data operation; and
      switch fabric configured to route data between the interface, the storage device, and the functional circuitry.

9. The electronic device of claim 8, wherein the storage device comprises a hard disk (HD), a solid-state drive (SSD) disk, or a random access memory disk (RAMdisk), or any combination thereof.

10. The electronic device of claim 8 wherein the storage controller comprises a non-volatile memory express (NVMe) controller, a serial AT adaptor (SATA) controller, or both.

11. The electronic device of claim 8, comprising a first data link coupling the integrated circuit to the processor and a second data link coupling the integrated circuit to the storage device, wherein a first bandwidth of the first data link is higher than a bandwidth of the second data link, wherein the functional circuitry is configured to perform a compression operation, and decompression operation.

12. The electronic device of claim 11, wherein the processor is configured to write data to the storage device by:
   sending the data to the interface;
   routing, using the switch fabric, the data from the interface to the functional circuitry;
   requesting performance of the compression operation over the data in the functional circuitry; and
   routing, using the switch fabric, the data from the functional circuitry to the storage controller.

13. The electronic device of claim 11, wherein the processor is configured to read data from the storage device by:
   requesting data from the storage device via the storage controller;
   routing, using the switch fabric, the data from the storage controller to the functional circuitry;
   requesting performance of the decompression operation over the data in the functional circuitry; and
   routing, using the switch fabric, the data from the functional circuitry to the interface.

14. The electronic device of claim 8, wherein the functional circuitry is configured to perform an error detection or error correction operation.

15. The electronic device of claim 8, comprising a cache coherent domain comprising the processor and a cache of the interface.

16. The electronic device of claim 15, comprising an operating memory coupled to the processor, wherein the cache coherent domain comprises the operating memory.

17. The electronic device of claim 8, comprising a system on chip (SoC) that comprises the processor and the integrated circuit.

18. The electronic device of claim 8, wherein the integrated circuit comprises a field programmable gate array (FPGA), an application specific integrated circuit (ASIC), or a hybrid device comprising hardened circuitry and programmable fabric.

19. A method comprising:
   sending, from a processor, data to an interface of an integrated circuit using a first data link that comprises a first bandwidth;

requesting a switch fabric of the integrated circuit to route the data to functional circuitry of the integrated circuit;

requesting, from the functional circuitry, compression of the data;

receiving, from the integrated circuit, a notification of completion of the compression of the data by the functional circuitry; and requesting the switch fabric of the integrated circuit to route the data from the functional circuitry to a storage device coupled to the integrated circuit using a second data link, wherein the second data link comprises a second bandwidth that is smaller than the first bandwidth.

20. The method of claim 19, comprising requesting from the functional circuitry, an error checking operation of the data.

* * * * *